(12) United States Patent
Salziger et al.

(10) Patent No.: US 10,101,394 B2
(45) Date of Patent: Oct. 16, 2018

(54) METHOD AND APPARATUS FOR DETERMINING THE AGING OF AN ELECTRONIC INTERRUPTER ELEMENT, IN PARTICULAR OF A POWER CONTACTOR

(71) Applicants: Robert Bosch GmbH, Stuttgart (DE); Samsung SDI Co., Ltd., Yongin-si, Gyeonggi-do (KR)

(72) Inventors: Jan Salziger, Esslingen (DE); Gergely Galamb, Traunstein (DE); Joshua Anzicek, Clarkston, MI (US); Dylan Propst, Plymouth, MI (US)

(73) Assignees: Robert Bosch GmbH, Stuttgart (DE); Samsung SDI Co., Ltd, Yongin-si, Gyeonggi-do (KR)

( * ) Notice: Subject to any disclaimer, the term of this patent is extended or adjusted under 35 U.S.C. 154(b) by 113 days.

(21) Appl. No.: 15/024,963

(22) PCT Filed: Sep. 9, 2014

(86) PCT No.: PCT/EP2014/069124
§ 371 (c)(1),
(2) Date: Mar. 25, 2016

(87) PCT Pub. No.: WO2015/043941
PCT Pub. Date: Apr. 2, 2015

(65) Prior Publication Data
US 2016/0231381 A1 Aug. 11, 2016

(30) Foreign Application Priority Data
Sep. 25, 2013 (DE) .................. 10 2013 219 243

(51) Int. Cl.
*G01R 31/327* (2006.01)
*G05B 23/02* (2006.01)
(Continued)

(52) U.S. Cl.
CPC .............. *G01R 31/327* (2013.01); *B60L 3/04* (2013.01); *B60W 20/50* (2013.01); *G05B 23/0283* (2013.01); *G07C 3/00* (2013.01)

(58) Field of Classification Search
CPC .............. G01R 31/3277; G01R 31/327; G01R 31/3274; G01R 31/3333; G01R 31/3272
(Continued)

(56) References Cited

U.S. PATENT DOCUMENTS 2,569,776 A * 10/1951 Persons ................ H01H 51/065
200/16 A
3,293,526 A * 12/1966 Boyajian .................. B60K 1/00
318/484
(Continued)

FOREIGN PATENT DOCUMENTS

DE          27 27 378          1/1979
DE    10 2008 018 709 A1     10/2009
(Continued)

OTHER PUBLICATIONS

International Search Report corresponding to PCT Application No. PCT/EP2014/069124, dated Nov. 4, 2014 (German and English language document) (5 pages).

*Primary Examiner* — Christopher McAndrew
(74) *Attorney, Agent, or Firm* — Maginot, Moore & Beck LLP (57) ABSTRACT

The disclosure relates to a method for determining the aging of an electronic interrupter element which is configured to open and close a power circuit. The method according to the disclosure comprises the following steps: a) initializing an aging counter NWear, b) determining the amount I of a current which flows through the electronic interrupter element upon opening the power circuit, c) determining a current-dependent aging value Nwear (I) from the amount I of the current, d) refreshing the aging counter NWear using (Continued)

the current-dependent aging value Nwear (I). The disclosure further relates to a computer program and to an apparatus for determining the aging of an electronic interrupter element and to a battery management system which are in particular configured to carry out the method.

10 Claims, 4 Drawing Sheets

(51) Int. Cl.
*G07C 3/00* (2006.01)
*B60L 3/04* (2006.01)
*B60W 20/50* (2016.01)

(58) Field of Classification Search
USPC .......................................................... 324/424
See application file for complete search history.

(56) References Cited

U.S. PATENT DOCUMENTS

| | | | | |
|---|---|---|---|---|
| 4,012,669 A | * | 3/1977 | Gelfand | H02H 3/093 361/97 |
| 4,670,812 A | * | 6/1987 | Doerfler | H02H 7/222 361/83 |
| 5,604,437 A | * | 2/1997 | Moncorge | G01R 31/3274 324/424 |
| 5,751,532 A | * | 5/1998 | Kanuchok | H02H 3/0935 361/115 |
| 6,762,588 B2 | * | 7/2004 | Miyazaki | B60L 11/185 320/116 |
| 6,891,352 B2 | * | 5/2005 | Miyazaki | B60L 11/185 320/118 |
| 7,091,695 B2 | * | 8/2006 | Miyazaki | B60L 11/185 320/116 |
| 8,319,465 B2 | * | 11/2012 | Franke | H02H 7/0816 318/434 |
| 8,756,559 B2 | * | 6/2014 | Shroff | G06F 17/5009 716/106 |
| 9,751,540 B2 | * | 9/2017 | Cook | B61H 11/00 |

FOREIGN PATENT DOCUMENTS

| | | |
|---|---|---|
| EP | 0 147 592 A1 | 7/1985 |
| EP | 0 258 090 A1 | 3/1988 |
| EP | 1 475 813 A1 | 11/2004 |
| EP | 1 649 573 | 4/2006 |
| JP | 5-11277 A | 1/1993 |
| JP | 6-178438 A | 6/1994 |
| JP | 2010-166644 A | 7/2010 |
| JP | 2012-63246 A | 3/2012 |
| WO | 2013/007429 A2 | 1/2013 |

* cited by examiner

METHOD AND APPARATUS FOR DETERMINING THE AGING OF AN ELECTRONIC INTERRUPTER ELEMENT, IN PARTICULAR OF A POWER CONTACTOR

This application is a 35 U.S.C. § 371 National Stage Application of PCT/EP2014/069124, filed on Sep. 9, 2014, which claims the benefit of priority to Serial No. DE 10 2013 219 243.6, filed on Sep. 25, 2013 in Germany, the disclosures of which are incorporated herein by reference in their entirety.

BACKGROUND

The disclosure relates to a method and a device for determining the aging of an electronic interruption element that is set up to open and close a circuit.

The subject matter of the disclosure is additionally a computer program and a battery management system that are set up particularly for carrying out the method.

DE 10 2008 018 709 B4 shows a method for storing and reading the number of switching cycles in electromagnetic switching devices. In this case, a total number of switching cycles is read and a decision-making unit checks whether the total number of switching cycles is greater than a device-specific parameter or a transfer value.

SUMMARY

The disclosure provides a method for determining the aging of an electronic interruption element that is set up to open and close a circuit, having the following steps:
a) Initialization of an aging counter $N_{wear}$,
b) determination of the absolute value I of a current that flows when the circuit is opened by the electronic interruption element,
c) determination of a current-dependent aging value $N_{wear}(I)$ from the absolute value I of the current,
d) refreshing of the aging counter $N_{wear}$ using the current-dependent aging value $N_{wear}(I)$.

Simple counting of the switching cycles cannot map the actual aging of the electronic interruption element, such as load switches, relays or contactors. The present disclosure involves not simply counting the number of switching cycles but rather accurately simulating the aging of the electronic interruption element by means of switch-on processes. Steps b) to d) are therefore preferably performed whenever the circuit is opened by the electronic interruption element.

The method is particularly suitable for electronic interruption elements that are used in circuits in which a current usually flows when the electronic interruption element is opened. According to the disclosure, it has been recognized that, in a case in which a current flows during the opening of the electronic interruption element, greater loading is placed on the contacts than through the mechanical loading alone, which can lead to premature failure of the electronic interruption element and hence to considerable safety problems. Critical responsibility for the aging of the electronic interruption element is borne by the current via the contacts, and hence primarily the current when the electronic interruption element is opened. The more advanced the aging of the electronic interruption element, the more probable is partial or total failure of the electronic interruption element. By way of example, failure of the electronic interruption element may manifest itself in the contacts sticking, i.e. in persistent closure during an opening operation even though the electronic interruption element should open the contacts.

The advantageous effect achieved by means of the measures of the disclosure is that the electronic interruption element can open the circuit at any time, which avoids critical situations.

The refreshing of the aging counter $N_{wear}$ can also be referred to as an update. According to one embodiment, every opening operation involves the ascertained aging value $N_{wear}(I)$ being added to the aging counter $N_{wear}$. The aging counter $N_{wear}$ therefore forms a kind of contribution account for the wear on the interruption element. Instead of a simple addition of the aging values $N_{wear}(I)$ to the aging counter $N_{wear}$, it is also possible for a time component to be considered, for example there may be provision for the aging values $N_{wear}(I)$ to be more significant in the course of time than at the beginning. The functional correlation when the time component is considered can follow a stair function in this case, or else be linear, polynomial or exponential.

A main application of the method is in hybrid and electric vehicles, in which a first component, such as a battery pack, are connected by power contactors to the further components, such as a drive, a supplementary generator, a charging connector, etc. The further components are supplied with power via a device that produces a single-phase or polyphase AC voltage or a clocked DC voltage from the battery voltage. Opening the circuit means isolating the electronic components from one another. The advantageous effect achieved by means of the measures of the disclosure is that the electronic interruption element can reliably isolate the components from one another at any time, which avoids critical situations. The method takes account of the actual loading that acts on the interruption element for different currents in the event of switch-off.

According to some embodiments, the electronic interruption element has a reference number $N_{mech}$ known for it that indicates a number of opening and/or closing operations for the electronic interruption element. The reference number $N_{mech}$ can be provided by manufacturers of the electronic interruption element and indicates a life for the electronic interruption element. By way of example, the reference number $N_{mech}$ can be taken from data sheets for electronic interruption elements. It is particularly advantageous if the current-dependent aging value $N_{wear}(I)$ is determined by means of division of the reference number $N_{mech}$ by a number $N_{break}(I)$ that indicates a number of reliably possible opening operations for a defined current in the circuit. By way of example, the values of $N_{break}(I)$ may be available in the form of a computable functional dependency or in table form, an example thereof being presented in table 1. In this example, $N_{mech}$ is 1 000 000.

TABLE 1

| I[A]    | $N_{brake}(I)$ | $N_{wear}(I)$ |
|---------|----------------|---------------|
| 0       | 1000000        | 1             |
| <=15    | 100000         | 10            |
| <=150   | 10000          | 100           |
| <=300   | 800            | 1250          |
| <=500   | 100            | 10000         |
| <=1000  | 8              | 125000        |
| <=1600  | 2              | 500000        |

The table indicates seven current ranges by way of example, namely a first range for what is known as a zero-current opening operation at 0 A, a second range for opening operations with currents between 0 and 15 A, a third range for opening operations with currents between 15 and 150 A, a fourth range for opening operations with currents between 150 and 300 A, a fifth range for opening operations with currents between 300 and 500 A, a sixth range for opening operations with currents between 500 and 1000 A and a seventh range for opening operations with currents between 1000 and 1600 A. The table indicates both the number $N_{break}(I)$, which indicates the number of reliably possible opening operations for each of the defined current ranges, and the current-dependent aging value $N_{wear}(I)$, which in this case is determined by means of division of the reference number $N_{mech}$ by the number $N_{break}(I)$. In this example, $N_{mech}$ is stipulated as 1 000 000 opening operations. It is clear that instead of seven ranges there may equally well be provision for fewer or more ranges, and that the number and limits thereof may be the result of practical tests, computations and/or specifications by the manufacturer.

In a preferred embodiment, the method has the following further steps:
  e) determination of the absolute value $\Delta U$ of a voltage difference that is applied across the electronic interruption element when the circuit is closed,
  f) determination of a voltage-dependent aging value $N_{wear}(\Delta U)$ from the absolute value $\Delta U$ of the voltage difference,
  g) refreshing of the aging counter $N_{wear}$ using the voltage-dependent aging value $N_{wear}(\Delta U)$.

The method is particularly suitable for electronic interruption elements that are used in circuits in which there is a voltage difference across the electronic interruption element when the electronic interruption element is closed. Steps e) to g) are preferably performed whenever the circuit is closed.

A physical process that intensifies the aging of the electronic interruption element when the circuit is closed under voltage is what is known as contact bouncing during closure. In the case of contact bouncing, the contact is not closed immediately, but rather the elasticity of the materials means that the contact briefly springs up again after closing, in which case an opening operation takes place under a flow of current. It is expected that although critical responsibility for the aging is borne by the current via the contact that needs to be overcome when the contactor is opened, the second factor, namely the flow of current when the contacts are closed, is also a way of making the statement about the aging of the electronic interruption element more accurately. The measures of the disclosure now allow these influences of the closing operations of the interruption element also to be counted when determining the aging of the electronic interruption element.

A main instance of application is circuits that are precharged via a capacitor. It has been recognized that, if there is a voltage difference when the electronic interruption element is connected, the capacitance of the capacitor means that the closure of the electronic interruption element is followed by the flow of a compensating current that can be determined from the voltage difference that needs to be bypassed for the internal resistance of the electronic interruption element. The compensating currents when the electronic interruption element is connected place greater loading on the contacts of the electronic interruption element than the mechanical loadings alone and can ensure premature failure of the electronic interruption element.

According to a preferred embodiment, the electronic interruption element has a reference number $N_{mech}$ known for it that indicates a number of opening and/or closing operations for the electronic interruption element. The reference number $N_{mech}$ indicates a life for the electronic interruption element to the manufacturer and, by way of example, can be taken from data sheets for electronic interruption elements, such as load switches, relays or contactors. It is particularly advantageous if the voltage-dependent aging value $N_{wear}(\Delta U)$ is determined by means of division of the reference number $N_{mech}$ by a number $N_{make}(\Delta U)$ that indicates a voltage-dependent number of opening and/or closing operations for the electronic interruption element. By way of example, the values of $N_{make}(\Delta U)$ can be available in the form of a computable functional dependency or in table form, an example thereof being presented in table 2. In this example, $N_{mech}$ is again 1 000 000.

TABLE 2

| $\Delta U[V]$ | $N_{make}(\Delta U)$ | $N_{wear}(\Delta U)$ |
| --- | --- | --- |
| 0 | 1000000 | 0 |
| >5 | 100000 | 10 |
| >10 | 10000 | 100 |
| >100 | 1000 | 1000 |
| >400 | 100 | 10000 |

For the voltage that is to be bypassed upon closure, five ranges are indicated here by way of example, a first range for zero-voltage or almost zero-voltage closure between 0 V and 5 V, a second range for closure between 5 V and above 10 V, a third range for closure between 10 V and 100 V and a fourth range for closure between 100 V and 400 V being defined. The further columns of the table indicate the number of reliably possible closing operations $N_{make}(\Delta U)$ and the voltage-dependent aging value $N_{wear}(\Delta U)$ that is added to the aging counter $N_{wear}$ for every closing operation. It is clear that instead of five ranges there may equally well be provision for fewer or more ranges, and that the number and limits thereof may be the result of practical tests, computations and/or specifications by the manufacturer.

According to a preferred embodiment, the ascertainment of the number $N_{make}(\Delta U)$ takes account of a capacitance of a capacitor and/or a magnitude of the resistor in the circuit. Thus, the loading on an interruption element in the case of a large capacitor, for example in the case of capacitors with more than 100 µF, more than 500 µF or more than 1 mF, and a small resistor is much greater because high compensating currents flow, for example brief currents of a few hundred amps. The knowledge of the actual current at the moment of opening, the difference in the voltages prior to closure of the electronic interruption element and in the capacitance of the capacitor, and hence the magnitude of the compensating current that is to be expected allow computation of the aging of the electronic interruption element for every single switching cycle.

It is particularly advantageous to ascertain a life limit $N_{EOL}$ for the electronic interruption element that is defined such that at the instant at which the life limit is reached the electronic interruption element is capable of still reliably opening the circuit for a desired current. By way of example, the life limit $N_{EOL}$ is determined by means of subtraction of the aging value $N_{break}(I_{EOLmax})$, which will arise for the final opening at a defined current value $I_{EOLmax}$, from the reference number $N_{mech}$, which indicates the manufacturer's life for the electronic interruption element. Advantageously, this ensures that the electronic interruption element is not replaced prematurely and that it is used only for as long as it is capable of reliably isolating the component in question.

At all times, the method allows assessment of whether the electronic interruption element will be capable, on the basis of preceding switching operations, of reliably isolating the component again after connection thereof. In this case and generally within the context of the disclosure, the term "reliably" means that series of tests, check seals or the like allow the response of the component to be expected and/or that use of the component within the indicated limits is legally permitted. If the decision turns out to be negative, a controlling piece of software or, by way of example, a battery management system can decide that the component is not connected in the first place.

Preferably, at the moment at which the aging counter $N_{wear}$ reaches or exceeds the life limit $N_{EOL}$ of the electronic interruption element an action is initiated. By way of example, the action may comprise an error message, in the case of an electric vehicle or hybrid vehicle an indication to the driver or else switching-off of the component in question or prevention of starting of the vehicle. Similarly, provision may be made for the vehicle to be put into what is known as a limp home mode, in which the engine speed is limited, for example, or in the case of a hybrid vehicle there is a switch to pure internal combustion engine operation. The effect achieved thereby is that the electronic interruption element is used only in the operational state.

By way of example, the electronic interruption element is a load switch, a relay or a transistor, preferably a power contactor that can be used particularly for a battery in an electric or hybrid vehicle. Particularly advantageously, the method is used for electronic interruption elements that are designed for use with high currents, particularly with currents larger than 10 A, 20 A or 50 A. In these cases, the current-dependent wear on the interruption element must be borne in mind to a particular degree. Use of the method is particularly suitable for batteries that are used in electric vehicles or hybrid vehicles. By way of example, demands on these batteries include that they should deliver between 50 and 600 V of voltage. Examples of suitable battery types include all types of lithium ion batteries. In the present description, the terms "battery" and "battery system" are used for storage battery and storage battery system, as conforms to standard parlance.

The disclosure additionally proposes a computer program according to which one of the methods described herein is performed when the computer program is executed on a programmable computer device. By way of example, the computer program may be a module for implementing a device for determining the aging of an electronic interruption element and/or of a battery management system in a vehicle. The computer program can be stored on a machine-readable storage medium, for example on a permanent or rewritable storage medium or in association with a computer device or on a removable CD-ROM, DVD or a USB stick. Additionally or alternatively, the computer program can be provided for download on a computer device, such as on the server, e.g. via a data network such as the Internet or a communication link such as a telephone line or a wireless connection.

According to a further aspect of the disclosure, a device for determining the aging of an electronic interruption element that is set up to open and close a circuit comprises a device for ascertaining the absolute value I of a current that flows when the circuit is opened by the electronic interruption element, a device for determining a current-dependent aging value $N_{wear}(I)$ from the absolute value I of the current that flows when the circuit is opened by the electronic interruption element, and a device for accumulating the ascertained current-dependent aging values $N_{wear}(I)$.

According to one embodiment, the device for determining the aging of the electronic interruption element has a device that can ascertain the flow of current even when the current is outside the measurement range for the incorporated current sensor. This can occur such that a device for ascertaining the voltage of a voltage source is provided and the device is set up to ascertain the absolute value I of the current that flows when the circuit is opened by the electronic interruption element from the voltage across the voltage source and the known or estimated internal resistance of the voltage source. Preferably, the voltage source corresponds to the battery system. When the measurement range is exceeded, a (short-circuit) current is computed from the known internal resistance of the battery system and the voltage on the battery system.

According to one embodiment, the device for determining the aging of the electronic interruption element has a device for ascertaining the absolute value $\Delta U$ of a voltage that is applied across the electronic interruption element when the circuit is closed and a device for determining a voltage-dependent aging value $N_{wear}(\Delta U)$ from the absolute value $\Delta U$ of the voltage that is applied across the electronic interruption element when the circuit is closed.

According to a further aspect of the disclosure, a battery manager comprises such a device for determining the aging of an electronic interruption element and/or is set up to carry out one of the methods described above. The battery manager may additionally be set up to ascertain the battery current and the voltage of individual battery cells, individual modules or the whole battery, and also the temperature thereof, and may also be set up to ascertain therefrom the state of charge of the battery cells (SOC), the state of health of the battery cells (SOH) and the admissible battery power. In the event of overload, if the SOC window is left or in the event of overtemperature, the battery management system may be set up to protect the battery cells by shutting down the system or by outputting a shutdown instruction. There are system configurations in which the battery management system can isolate the battery cells from the remainder of the onboard power supply system by means of contactors in the event of hazardous states, but also other configurations in which the battery management system only outputs power limits, while another controller needs to decide about the circuit.

It has been recognized that if a current flows during the opening of the electronic interruption element then the contacts are placed under greater load than in the case of zero-current opening solely by virtue of the mechanical loading, which can lead to premature failure of the electronic interruption element and hence to significant safety problems in the circuit. The advantageous effect achieved by the measures of the disclosure is that the electronic interruption element can be connected only if it can also reliably open the circuit again, which avoids critical situations.

BRIEF DESCRIPTION OF THE DRAWINGS

Exemplary embodiments of the disclosure are shown in the drawings and explained in more detail in the description below.

In the drawings.

DETAILED DESCRIPTION

Figure 1:
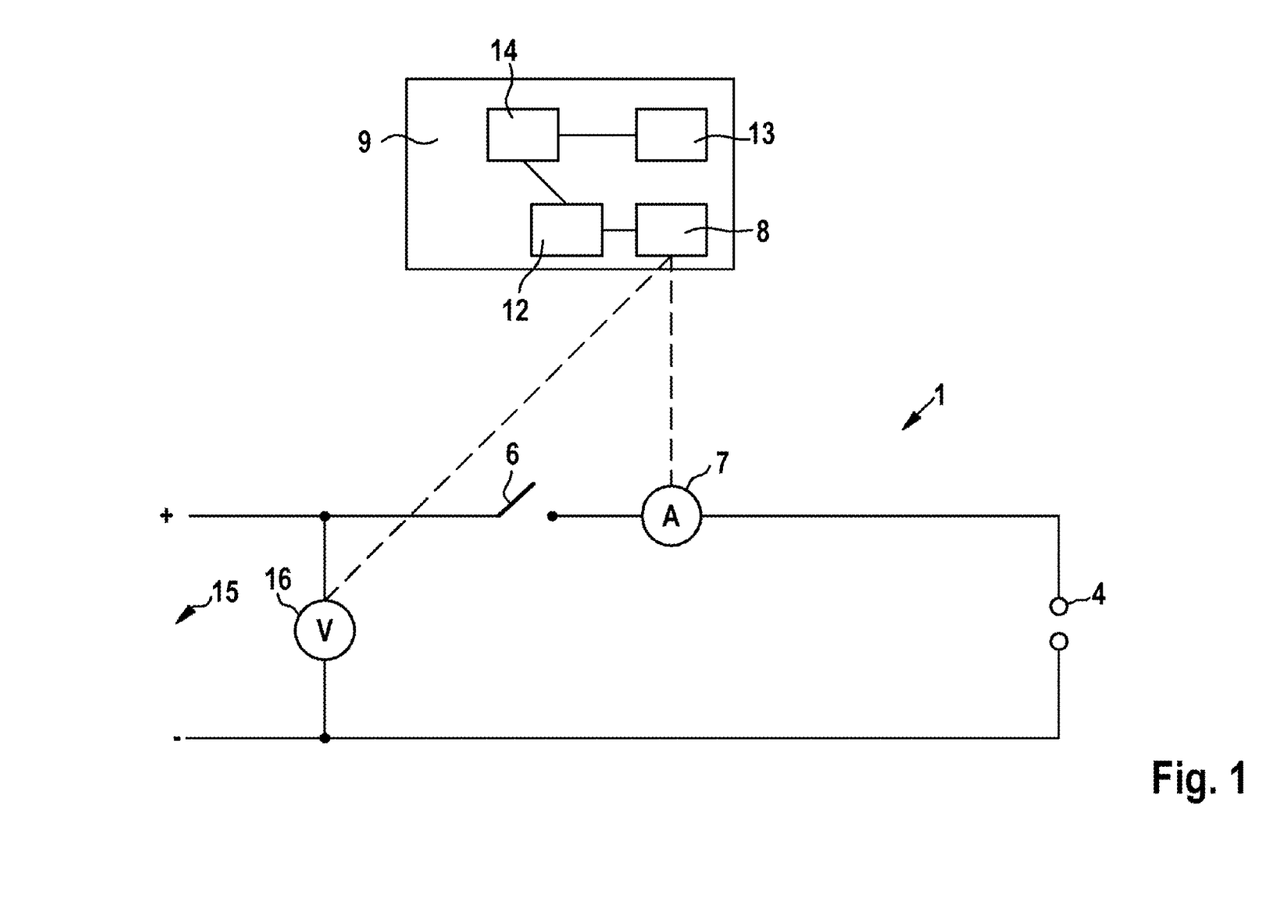
FIG. 1 shows a circuit with an electronic interruption element.

FIG. 1 shows a circuit 1 with an electronic interruption element 6 that is set up to isolate a voltage source 15, for example a battery, from an electrical component 4. FIG. 1 shows a device 7 for ascertaining the current that flows when the circuit is opened by the electronic interruption element 6, which device is coupled to a device 8 for determining a current-dependent aging value $N_{wear}(I)$ from the absolute value of the current that flows when the circuit is opened by the electronic interruption element 6. The device 8 for determining the current-dependent aging value $N_{wear}(I)$ may be a component of a battery management system 9, for example. The device 8 for determining the current-dependent aging value $N_{wear}(\Delta U)$ is connected to a device 12 for refreshing an aging counter $N_{wear}$, which device is likewise a component of the battery management system 9 in the exemplary embodiment shown.

In addition, the device for determining the aging of the electronic interruption element 6 has a device 13 for ascertaining a life limit $N_{EOL}$ for the electronic interruption element 6. The device 13 for ascertaining the life limit $N_{EOL}$ of the electronic interruption element 6 is set up to subtract an aging value $N_{break}(I_{EOLmax})$ from a reference number $N_{mech}$ in order to indicate the life for the electronic interruption element 6 such that a final opening operation can be performed at a defined current value $I_{EOLmax}$. A further device 14, which receives data and/or measured values from the device 13 for ascertaining the life limit $N_{EOL}$ and from the device 12 for refreshing an aging counter $N_{wear}$ is set up to initiate an action when the aging counter $N_{wear}$ exceeds the life limit $N_{EOL}$. By way of example, the action may comprise sending of an error message, a display to the driver of a vehicle, switching-off of the component in question or prevention of starting of the vehicle or a limp home operating state of the vehicle.

FIG. 1 additionally shows a device 16 for ascertaining a voltage across the voltage source 15 that provides data and/or measured values for the device 8 for ascertaining the current. According to this preferred embodiment, the device 8 is set up to take the voltage profile at the voltage source 15 and to ascertain the flow of current even when the current is outside the measurement range of the device 7 for ascertaining the current. If the measurement range of the device 7 is exceeded then the device 8 computes the current from the known internal resistance of the battery system and the voltage across the voltage source 15.

Figure 2:
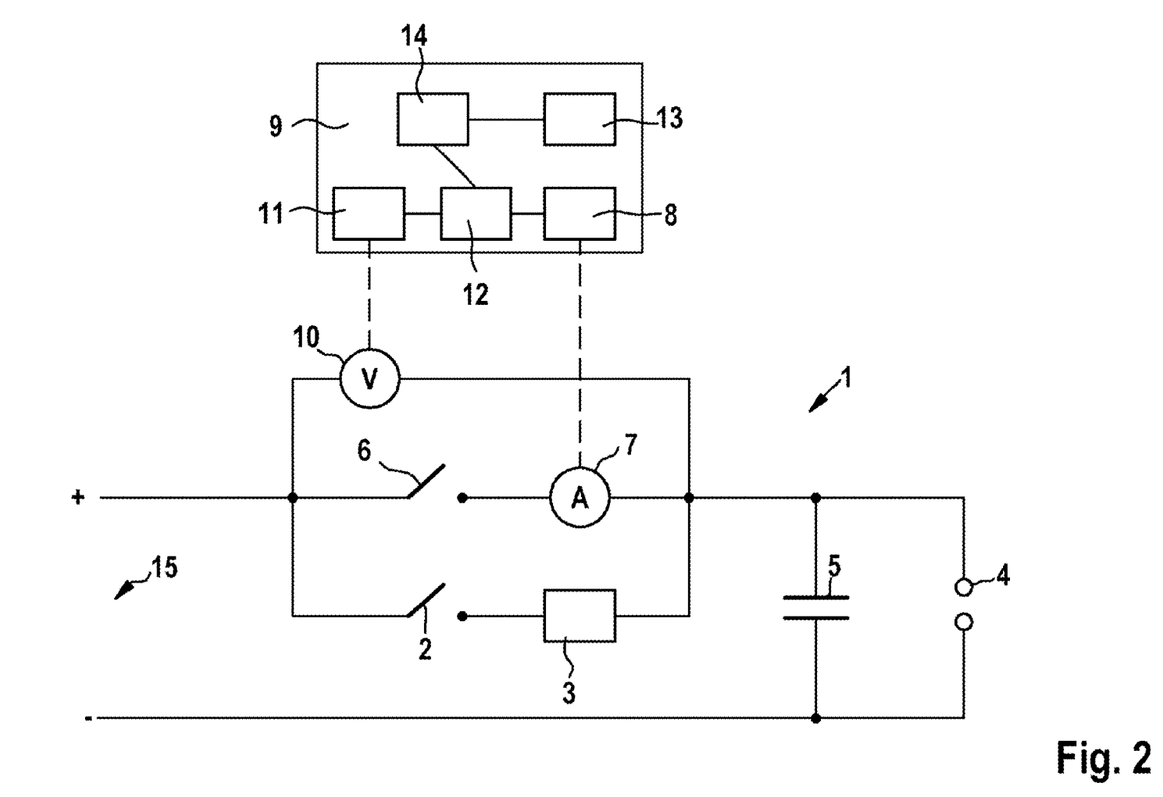
FIG. 2 shows a circuit with two electronic interruption elements.

FIG. 2 shows a precharging circuit for an electrical component 4. The circuit 1 has a further electronic interruption element 2 besides the first interruption element 6 shown in FIG. 1. The circuit additionally comprises a precharge resistor 3 and a capacitor 5. To complete the connection between the component 4 and the voltage source 15, the element 2 is first of all closed and the capacitor 5 is brought to the same voltage level with a small current using the precharge resistor 3. The element 6 can then make the connection at low impedance. In order to break the connection between the component 4 and the voltage source 15, the electrical component 4 usually reduces its current draw to a minimum, the electronic interruption element 6 then opens. During operation, it is not always possible for the capacitor 5 to be precharged to the voltage completely before the electronic interruption element 6 closes or to bring the current to a minimum, ideally 0 A, before the electronic interruption element 6 opens.

Therefore, the electronic circuit shown in FIG. 2 with the device for determining the aging of the electronic interruption element 6 additionally has a device 10 for determining the absolute value $\Delta U$ of a voltage difference that is applied across the electronic interruption element when the circuit is closed. The device 10 for determining the absolute value $\Delta U$ of the voltage difference is coupled to a device 11 for determining a voltage-dependent aging value $N_{wear}(\Delta U)$ that ascertains the voltage-dependent aging value $N_{wear}(\Delta U)$ from the absolute value $\Delta U$ of the voltage difference that is applied across the electronic interruption element when the circuit is closed. The device 11 for determining the voltage-dependent aging value $N_{wear}(\Delta U)$ is connected to the device 12 for refreshing the aging counter $N_{wear}$ and provides said device with data and/or measured values.

As in FIG. 1, the device 7 for ascertaining the current that flows when the circuit is opened by the electronic interruption element 6 is again present and is coupled with the device 8 for determining the current-dependent aging value $N_{wear}(I)$ from the absolute value of the current that flows when the circuit is opened by the electronic interruption element 6. The device 8 for determining the current-dependent aging value $N_{wear}(I)$ may be a component of the battery management system 9. The device 8 for determining the current-dependent aging value $N_{wear}(\Delta U)$ is connected to the device 12 for refreshing an aging counter $N_{wear}$ and provides said device with data and/or measured values.

In addition, the device for determining the aging of the electronic interruption element 6 has the device 13 for ascertaining the life limit of the electronic interruption element 6, and also the further device 14 for initiating the action when the aging counter $N_{wear}$ exceeds the life limit $N_{EOL}$.

The embodiment shown can again advantageously have the device 16 for ascertaining the voltage across the battery 15 that is described with reference to FIG. 1, this not being shown in addition. In such embodiments, the device 8 is again set up to ascertain from the voltage profile on the battery system the flow of current when the current is outside the measurement range of the device 7 for ascertaining the current.

Figure 3:
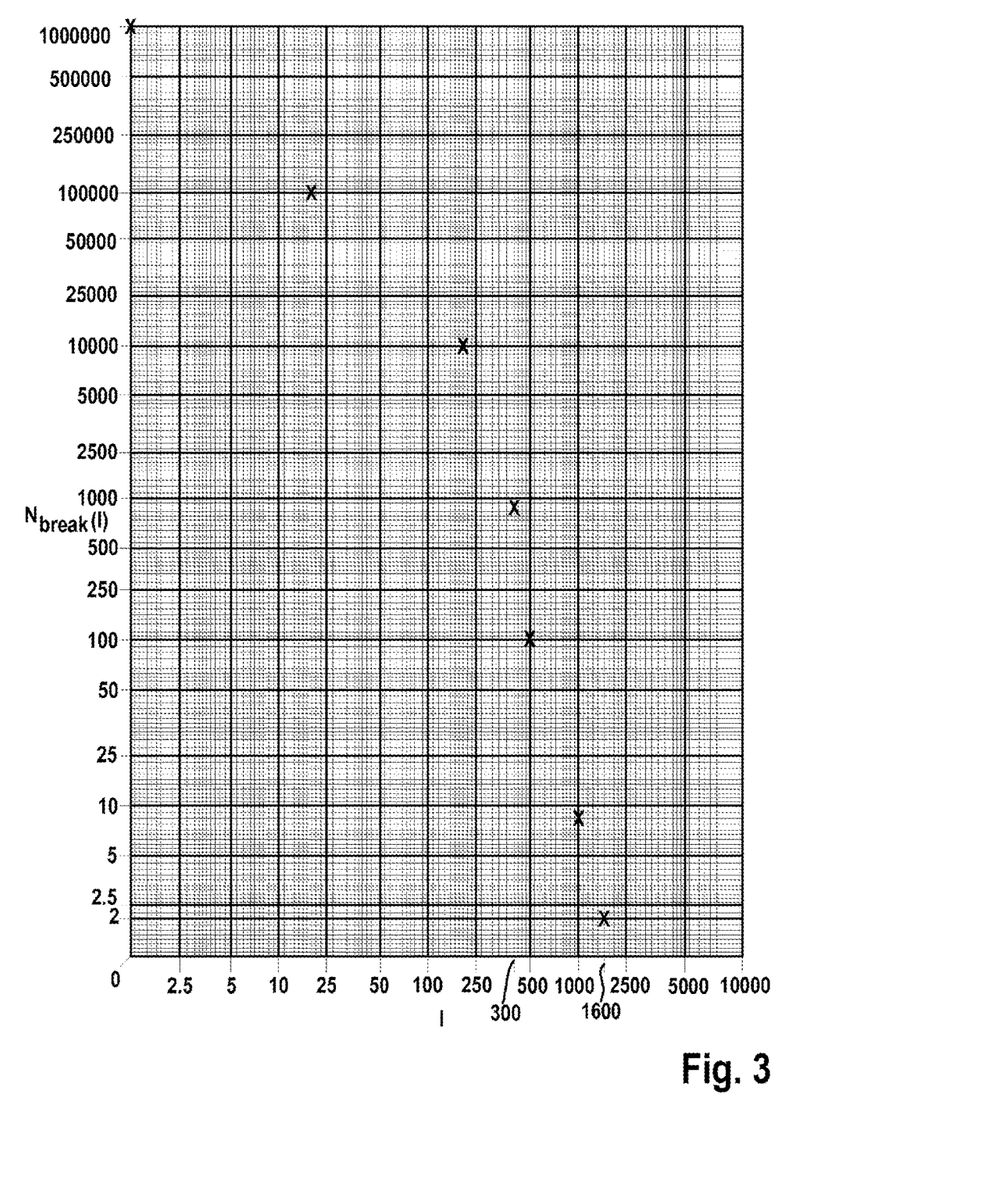
FIGS. 3 and 4 show graphs that indicate the number of reliably possible opening operations and closing operations as a function of current and voltage.
Figure 4:
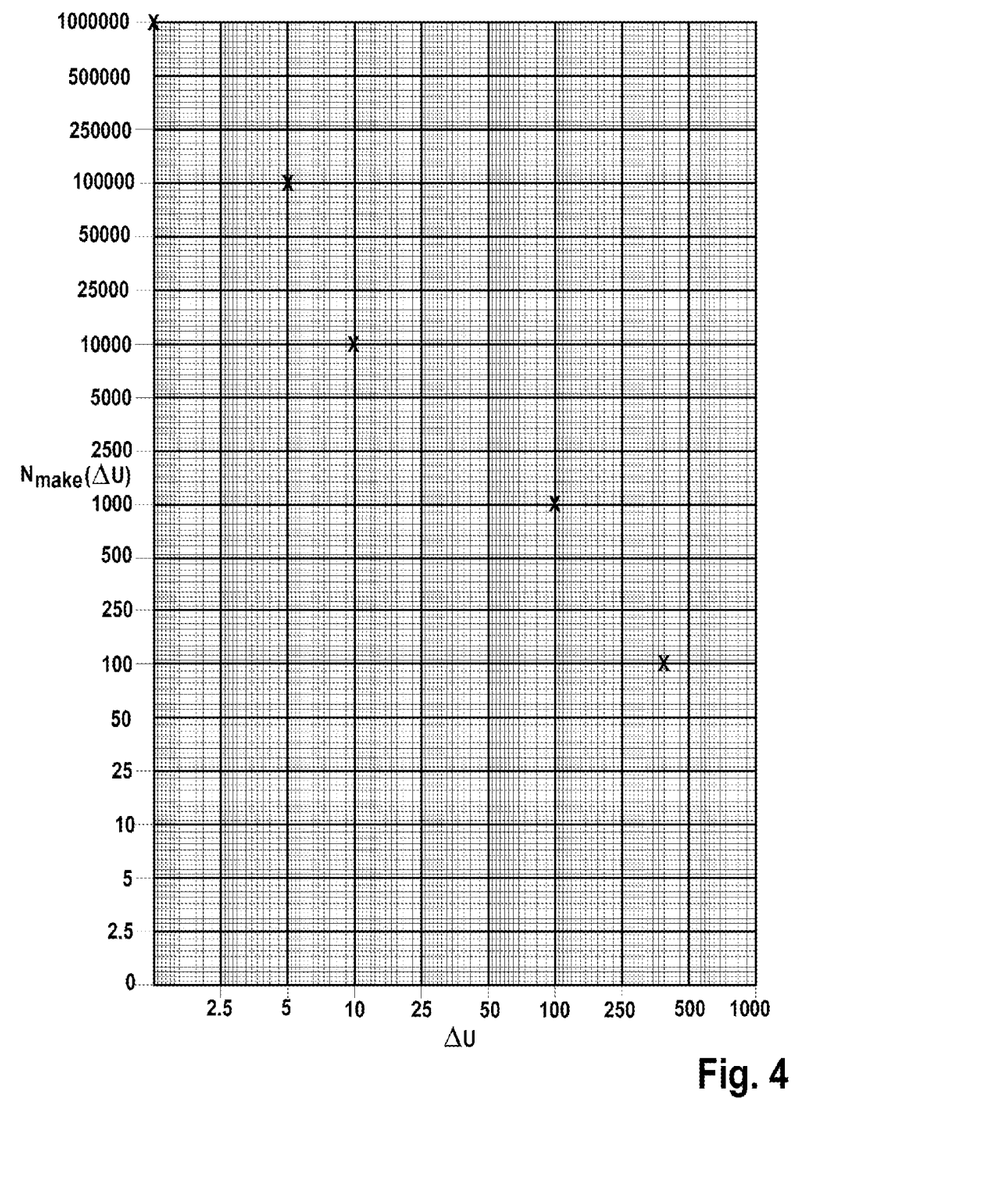

FIGS. 3 and 4 use dual logarithmic paper to show dependencies that correspond to the values indicated in tables 1 and 2. The selected data points are again intended to be understood by way of example. Such graphs can be used for providing functional dependencies, for example by virtue of the indicated points being interpolated in a suitable manner, for example in stepped fashion or linearly. A correct functional correlation may also be the result of series of tests. By way of example, the indicated data points may have been taken from a data sheet for a power contactor, for example a power contactor that is meant to be designed for a high voltage of 400 V.

The method is clarified using a short computational example, the computational example being intended to be based on the functional relationship of $N_{wear}(I)$ and $N_{wear}(\Delta U)$ according to FIGS. 3 and 4, or tables 1 and 2. If the electronic interruption element is meant to open at a current of 1600 A, for example, at the end of life, then this means, according to FIG. 3, that only two interruptions are reliably possible given such a high flow of current. The reference number $N_{mech}$ is 1 000 000 in the chosen example, which can be read off on the basis of the values at I=0 A and $\Delta U$=0 V in FIGS. 3 and 4.

The quotient of $N_{mech}$ and $N_{break}(I_{EOLmax})$ yields $N_{wear}(I_{EOLmax})$, $$N_{wear}(1600\ A) = \frac{N_{mech}}{N_{break}(1600\ A)} = \frac{1000000}{2} = 500000.$$

The life is therefore obtained as $N_{EOL} = N_{mech} - N_{wear}(1600\ A) = 500\ 000.$ During operation of the electronic interruption element, the following events may occur, for example:

| | |
|---|---|
| Opening 40000 times at I = 0 A | 40 000 × $N_{wear}$ (0 A) = 40000 |
| Closing 40000 times at ΔU = 0 V | 40 000 × $N_{wear}$ (0 V) = 0 |
| Opening 1000 times at I = 20 A | 1000 × $N_{wear}$ (20 A) = 100000 |
| Closing 1000 times at ΔU = 5 V | 1000 × $N_{wear}$ (5 V) = 10000 |
| Opening twice at I = 500 A | 2 × $N_{wear}$ (500 A) = 250000 |
| Closing 10 times at ΔU = 400 V | 10 × $N_{wear}$ (400 V) = 100000 |
| Total: | $N_{wear}$ = 500000. |

In the computational example, the end of life $N_{EOL}$ has been reached, which means that an action is carried out.

The disclosure is not limited to the exemplary embodiments described here and the aspects highlighted therein, but rather a large number of modifications that are within the bounds of action of a person skilled in the art are possible.

The invention claimed is:

1. A method for determining an aging of an electronic interruption element that is configured to open and close a circuit, the method comprising:
   a) initializing an aging counter $N_{wear}$;
   b) determining an absolute value I of a current that flows when the circuit is opened by the electronic interruption element;
   c) determining an aging value $N_{wear}(I)$ that is dependent on the absolute value I of the current;
   d) refreshing the aging counter $N_{wear}$ using the aging value $N_{wear}(I)$,
   wherein the electronic interruption element has a reference number $N_{mech}$ known for it that indicates a number of opening and closing operations for the electronic interruption element, the method further comprising:
      ascertaining the aging value $N_{wear}(I)$ based on a division of the reference number $N_{mech}$ by a number $N_{break}(I)$, the number $N_{break}(I)$ indicating a current-dependent number of opening and closing operations for the electronic interruption element.

2. The method as claimed in claim 1, further comprising:
   e) determining an absolute value ΔU of a voltage difference across the electronic interruption element when the circuit is closed;
   f) determining an aging value $N_{wear}(\Delta U)$ that is dependent on the absolute value ΔU of the voltage difference; and
   g) refreshing the aging counter $N_{wear}$ using the aging value $N_{wear}(\Delta U)$.

3. The method as claimed in claim 2, wherein the electronic interruption element has a reference number $N_{mech}$ known for it that indicates a number of opening and/or closing operations for the electronic interruption element, the method further comprising:
   determining the aging value $N_{wear}(\Delta U)$ based on a division of the reference number $N_{mech}$ by a number $N_{make}(\Delta U)$, the number $N_{make}(\Delta U)$ indicating a voltage-dependent number of opening and closing operations for the electronic interruption element.

4. The method as claimed in claim 3, further comprising: ascertaining the number $N_{make}(\Delta U)$ taking into account a capacitance of a capacitor and a resistance of a resistor.

5. The method as claimed in claim 1, further comprising: ascertaining a life limit for the electronic interruption element.

6. The method as claimed in claim 5, further comprising: initiating an action at a moment at which the aging counter $N_{wear}$ at least one of reaches and exceeds the life limit of the electronic interruption element.

7. The method as claimed in claim 1, wherein the electronic interruption element is a power contactor for a battery in at least one of an electric vehicle and hybrid electric vehicle.

8. A computer program for determining an aging of an electronic interruption element that is configured to open and close a circuit, the computer program being stored on a non-transitory storage medium and configured to, when the computer program is executed on a programmable computer device:
   a) initialize an aging counter $N_{wear}$;
   b) determine an absolute value I of a current that flows when the circuit is opened by the electronic interruption element;
   c) determine an aging value $N_{wear}(I)$ that is dependent on the absolute value I of the current; and
   d) refresh the aging counter $N_{wear}$ using the aging value $N_{wear}(I)$,
   wherein the electronic interruption element has a reference number $N_{mech}$ known for it that indicates a number of opening and closing operations for the electronic interruption element, the method further comprising:
      ascertaining the aging value $N_{wear}(I)$ based on a division of the reference number $N_{mech}$ by a number $N_{break}(I)$, the number $N_{break}(I)$ indicating a current-dependent number of opening and closing operations for the electronic interruption element.

9. A method for determining an aging of an electronic interruption element that is configured to open and close a circuit, the method comprising:
   a) initializing an aging counter $N_{wear}$;
   b) determining an absolute value I of a current that flows when the circuit is opened by the electronic interruption element;
   c) determining an aging value $N_{wear}(I)$ that is dependent on the absolute value I of the current;
   d) refreshing the aging counter $N_{wear}$ using the aging value $N_{wear}(I)$;
   e) determining an absolute value ΔU of a voltage difference across the electronic interruption element when the circuit is closed;
   f) determining an aging value $N_{wear}(\Delta U)$ that is dependent on the absolute value ΔU of the voltage difference; and
   g) refreshing the aging counter $N_{wear}$ using the aging value $N_{wear}(\Delta U)$,
   wherein the electronic interruption element has a reference number $N_{mech}$ known for it that indicates a number of at least one of (i) opening and (ii) closing operations for the electronic interruption element, the method further comprising:
      determining the aging value $N_{wear}(\Delta U)$ based on a division of the reference number $N_{mech}$ by a number $N_{make}(\Delta U)$, the number $N_{make}(\Delta U)$ indicating a voltage-dependent number of opening and closing operations for the electronic interruption element.

10. The method as claimed in claim 9, further comprising: ascertaining the number $N_{make}(\Delta U)$ taking into account a capacitance of a capacitor and a resistance of a resistor.

* * * * *